United States Patent
Namiki et al.

(10) Patent No.: US 12,391,266 B2
(45) Date of Patent: Aug. 19, 2025

(54) STATE ESTIMATION METHOD AND STATE ESTIMATION SYSTEM

(71) Applicant: HONDA MOTOR CO., LTD., Tokyo (JP)

(72) Inventors: Shigeru Namiki, Wako (JP); Minoru Uoshima, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 249 days.

(21) Appl. No.: 18/168,642

(22) Filed: Feb. 14, 2023

(65) Prior Publication Data
US 2023/0303097 A1    Sep. 28, 2023

(30) Foreign Application Priority Data
Mar. 25, 2022    (JP) .................................. 2022-050927

(51) Int. Cl.
*B60W 50/04*    (2006.01)
*B60W 50/00*    (2006.01)

(52) U.S. Cl.
CPC ... *B60W 50/045* (2013.01); *B60W 2050/0043* (2013.01)

(58) Field of Classification Search
CPC ......... B60W 50/045; B60W 2050/0043; H02J 2310/48; H02J 7/0048; H02J 7/005; G01R 31/367; G01R 31/392; G01R 31/382; B60L 2260/46; B60L 58/10; Y02E 60/10
See application file for complete search history.

(56) References Cited

U.S. PATENT DOCUMENTS

| 2021/0256422 A1* | 8/2021 | Unterthiner ....... G06F 18/24137 |
| 2022/0134904 A1* | 5/2022 | Namiki .................... G06N 3/08 320/104 |
| 2022/0157091 A1* | 5/2022 | Kishida ................ G07C 5/0816 |

FOREIGN PATENT DOCUMENTS

JP    2015-099042 A    5/2015

OTHER PUBLICATIONS

Yang, Ruixin, et al. "A novel method on estimating the degradation and state of charge of lithium-ion batteries used for electrical vehicles." Applied Energy 207 (2017): 336-345. (Year: 2017).*
(Continued)

*Primary Examiner* — Ramya P Burgess
*Assistant Examiner* — Ana D Thomas
(74) *Attorney, Agent, or Firm* — Rankin, Hill & Clark LLP

(57) ABSTRACT

A state estimation method includes a first step of preparing a plurality of first estimation models estimating a state of an object to be monitored based on a state variable measured with respect to the state of the object to be monitored, a second step of preparing a second estimation model estimating, from among the plurality of first estimation models, which one of the first estimation models estimates the state of the object to be monitored with the highest accuracy based on the state variable measured with respect to the object to be monitored or a state variable measured with respect to a utilization device that runs by using the object to be monitored, and a third step of outputting a result of estimation of the state of the object to be monitored of the one first estimation model estimated by the second estimation model.

5 Claims, 6 Drawing Sheets

(56) References Cited

OTHER PUBLICATIONS

Yang, Ruixin, et al. "A novel method on estimating the degradation and state of charge of lithium-ion batteries used for electrical vehicles." Applied Energy 207 (2017): 336-345. (Year: 2017) (Year: 2017).*

Pattipati, Bharath, Chaitanya Sankavaram, and Krishna Pattipati. "System identification and estimation framework for pivotal automotive battery management system characteristics." IEEE Transactions on Systems, Man, and Cybernetics, Part C (Applications and Reviews) 41.6 (2011): 869-884. (Year: 2011).*

* cited by examiner

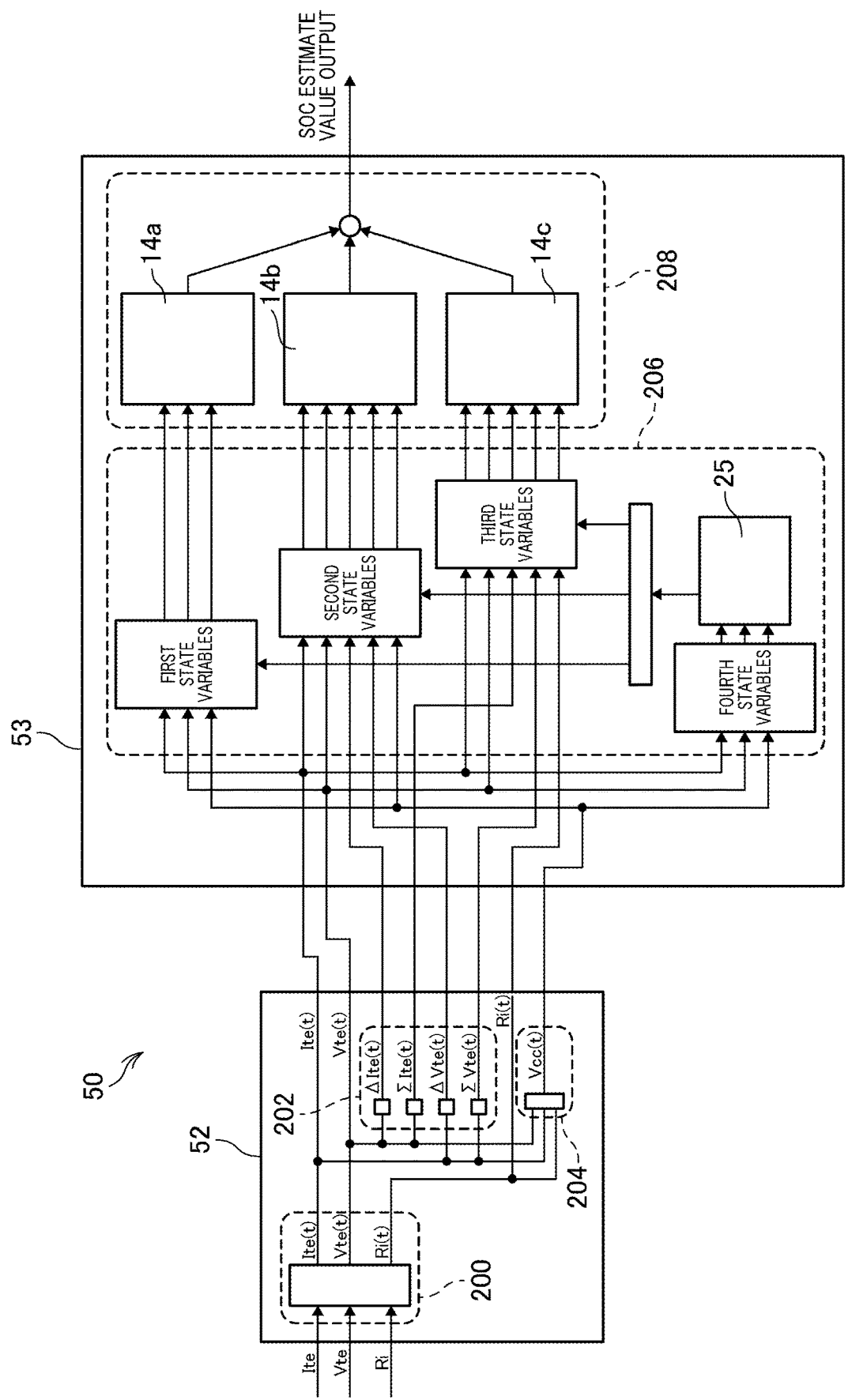

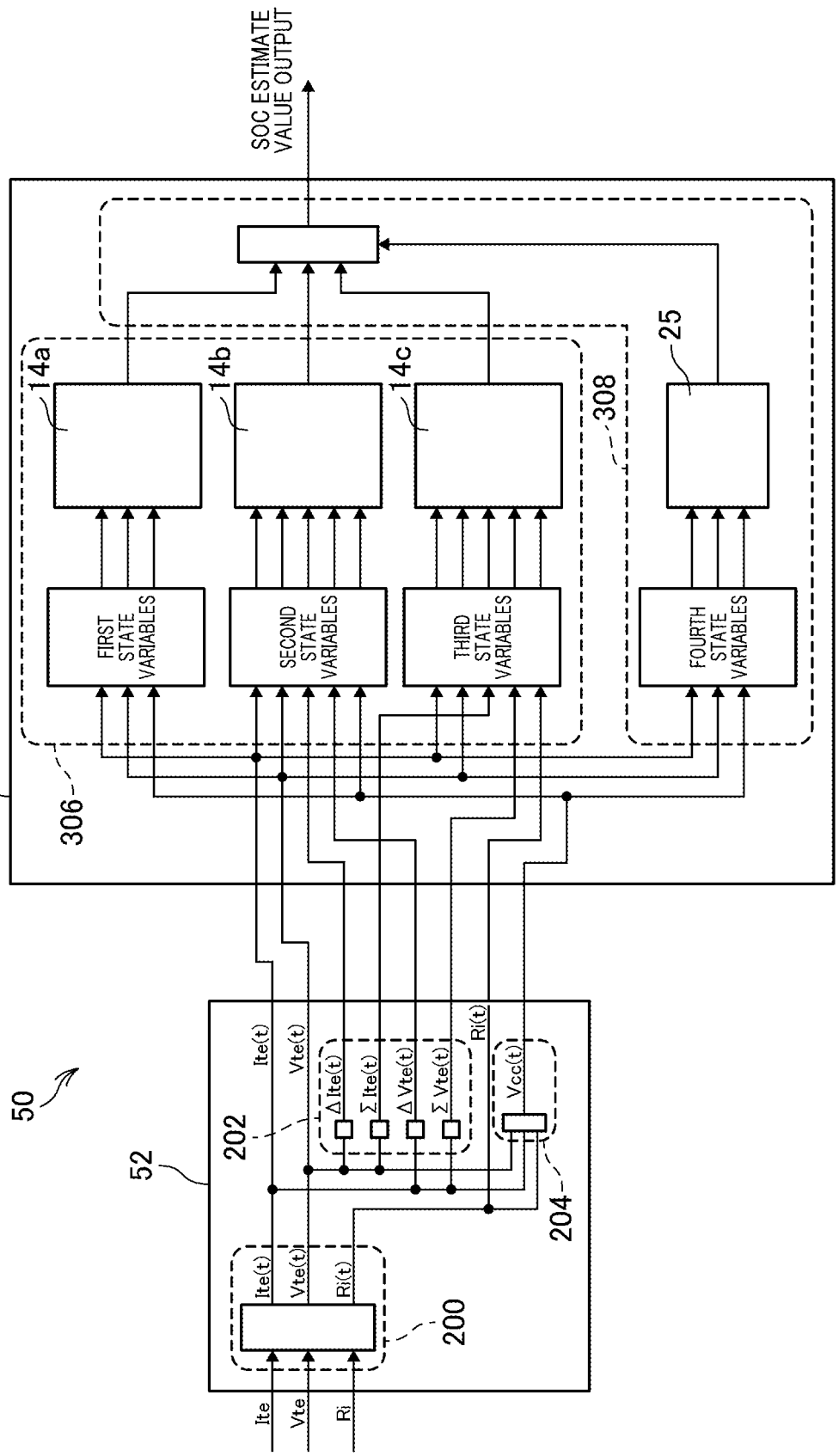

STATE ESTIMATION METHOD AND STATE ESTIMATION SYSTEM

INCORPORATION BY REFERENCE

The present application claims priority under 35 U.S.C. § 119 to Japanese Patent Application No. 2022-050927 filed on Mar. 25, 2022. The content of the application is incorporated herein by reference in its entirety.

BACKGROUND OF THE INVENTION

Field of the Invention

The present invention relates to a state estimation method and a state estimation system for estimating a state of an object to be monitored.

Description of the Related Art

A residual quantity estimation device of a secondary battery is disclosed in Japanese Patent Laid-Open No. 2015-99042. In this residual quantity estimation device, different residual quantity ranges are assigned, as assigned ranges, to a plurality of estimation devices each configured with a neural network. The respective estimation devices generate a plurality of intermediate estimate values, which indicate estimate values of the residual quantity of the secondary battery on the basis of the same input data and the same technique, and an output control unit selects one of these intermediate estimate values to output a final estimate value.

However, when the plurality of estimation devices on the basis of the same input data and the same technique are used, even if each of the estimation devices is assigned a different residual quantity range, an estimate value having a high accuracy may not necessarily be output in the assigned residual quantity range depending on variation and the like of temporal behavior of the input data, for example.

The present invention has been made in consideration of the circumstance described above, and is intended to estimate the state of an object to be monitored in a more stable and accurate manner.

SUMMARY OF THE INVENTION

A first aspect of the present invention is a state estimation method for estimating a state of an object to be monitored, the state estimation method including a first step of preparing a plurality of first estimation models for estimating the state of the object to be monitored on the basis of a state variable measured with respect to the object to be monitored, a second step of preparing a second estimation model for estimating, from among the plurality of first estimation models, which one of the first estimation models estimates the state of the object to be monitored with the highest accuracy, on the basis of the state variable measured with respect to the object to be monitored or a state variable measured with respect to a utilization device that runs by using the object to be monitored, and a third step of outputting a result of estimation of the state of the object to be monitored of the one first estimation model estimated by the second estimation model.

According to another aspect of the present invention, in the third step, the state of the object to be monitored is estimated by using only the one first estimation model estimated by the second estimation model, and the result of the estimation is output.

According to another aspect of the present invention, in the third step, an estimation result of the state of the object to be monitored in each of the plurality of first estimation models is acquired, and the estimation result of the one first estimation model estimated by the second estimation model from among the acquired estimation results, is output.

According to another embodiment of the present invention, in at least some of the plurality of first estimation models, model structures are different from each other.

According to another embodiment of the present invention, the plurality of first estimation models include a machine learning model.

According to another embodiment of the present invention, at least some of the plurality of first estimation models are machine learning models trained by using learning data that are different from each other According to another embodiment of the present invention, the first estimation model includes a rule-based model.

According to another embodiment of the present invention, in at least some of the plurality of first estimation models, combinations of parameters included in the state variable to be input are different from each other.

According to another embodiment of the present invention, the object to be monitored is a secondary battery in operation, and the first estimation model estimates a charging rate and/or a degree of deterioration of the secondary battery in operation as the state of the object to be monitored.

Another aspect of the present invention is a state estimation system for estimating a state of an object to be monitored, the state estimation system including a plurality of first estimation models for estimating the state of the object to be monitored on the basis of a state variable measured with respect to the object to be monitored, a second estimation model for estimating, from among the plurality of first estimation models, which one of the first estimation models estimates the state of the object to be monitored with the highest accuracy on the basis of the state variable measured with respect to the object to be monitored or a state variable measured with respect to a utilization device that runs by using the object to be monitored, and a state estimation unit for estimating the one first estimation model by way of the second estimation model on the basis of a state variable of the object to be monitored or a state variable of the utilization device that are measured at present so as to estimate and output the state of the object to be monitored from the state variable of the object to be monitored that is measured at present by using the estimated one first estimation model.

According to the aspects of the present invention, it is possible to estimate the state of the object to be monitored in a more stable and accurate manner. Further, because of this, it is possible to improve energy effectiveness in a vehicle by using a secondary battery in the vehicle as the object to be monitored and performing the state estimation thereof in an accurate manner (SDGs 7.3, 7.a).

BRIEF DESCRIPTION OF THE DRAWINGS

FIG. 5 is a functional block diagram of the state estimation system; and

FIG. 6 is a functional block diagram of a state estimation system including a state estimation unit according to a modification.

DETAILED DESCRIPTION OF THE PREFERRED EMBODIMENTS

Hereinafter, embodiments of the present invention will be described with reference to drawings.

Figure 1:
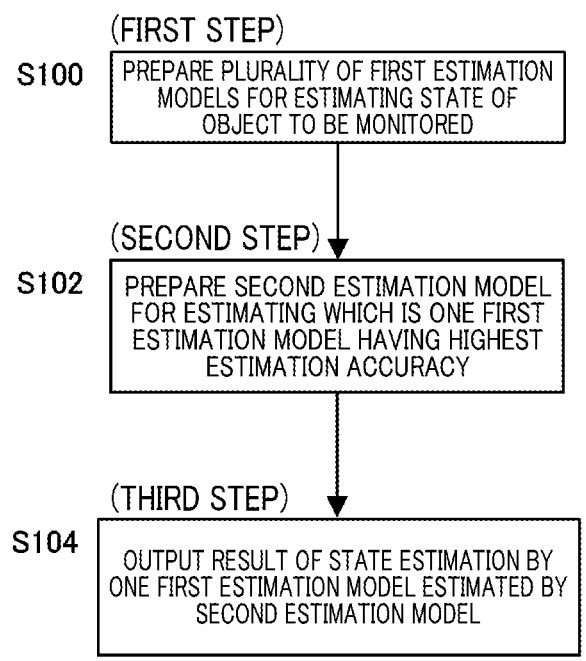
FIG. 1 is a flow diagram showing the procedures of a state estimation method according to an embodiment of the present invention.

FIG. 1 is a diagram that shows the procedures of a state estimation method according to an embodiment of the present invention.

The state estimation method includes a first step (S100) of preparing a plurality of first estimation models for estimating a state of an object to be monitored on the basis of a state variable measured with respect to the object to be monitored. Further, the state estimation method includes a second step (S102) of preparing a second estimation model for estimating, from among the plurality of first estimation models, which one of the first estimation models estimates the state of the object to be monitored with the highest accuracy on the basis of the state variable measured with respect to the object to be monitored or a state variable measured with respect to a utilization device that runs by using the object to be monitored. Further, the state estimation method includes a third step (S104) of outputting a result of estimation of the state of the object to be monitored of the one first estimation model estimated by the second estimation model.

Here, it is preferable that in at least some of the plurality of first estimation models, model structures be different from each other. For example, the plurality of first estimation models can include a rule-based model and/or a machine learning model. This makes it possible to estimate the state by using the plurality of first estimation models having various characteristics. As a result, it is possible to obtain one estimate value outputs having a higher accuracy.

The model structures of the machine learning model that can be used for the first estimation model can include a Recurrent Neural Network (RNN) including, as an intermediate layer thereof, a Long Short Term Memory (LSTM) or a Gated Recurrent Unit (GRU), and/or a one-dimensional Convolutional Neural Network (CNN).

Further, for the reason similar to the above, when the plurality of first estimation models include a plurality of machine learning models, particularly when the plurality of first estimation models include the plurality of machine learning models having the same model structure, it is preferable that these machine learning models be trained by using learning data that are different from each other.

Furthermore, for a reason similar to the above, it is preferable that in at least some of the plurality of first estimation models, combinations of parameters included in the state variable to be input be different from each other.

In the present embodiment, as an example, the object to be monitored is a secondary battery in operation, and a charging rate and/or a full capacity [Ah] that is a charge amount at the time of a full charge or a degree of deterioration of the secondary battery in operation are estimated as the state of the object to be monitored. Further, the first estimation model and the second estimation model are machine learning models in the present embodiment. However, this is an example, and the first estimation model and the second estimation model can be the ones that use a model other than the machine learning model. Hereinafter, the charging rate is abbreviated as an SOC, the full capacity [Ah] that is a charge amount at the time of a full charge or the degree of deterioration is abbreviated as an SOH.

Specifically, in the present embodiment, in step S100, the plurality of first estimation models are prepared that have learned, by machine learning, the relations of the state variables that indicate an electric input, an electric output, and/or an electric characteristic of the secondary battery in operation to which a load or a charger is connected, with the SOC and/or the SOH of the secondary battery. Further, in the present embodiment, in step S102, the second estimation model is prepared that has learned, by machine learning, the relation of the state variables of the secondary battery in operation, to a selection of the one first estimation model for estimating the SOC and/or the SOH with the highest accuracy. Further, in the present embodiment, in step S104, an estimation result of the charging rate and/or the degree of deterioration of the secondary battery in operation of the one first estimation model estimated by the second estimation model from among the state variables of the secondary battery in operation, is output.

Hereinafter, the processing in each step will be described.

[First Step]

Figure 2:
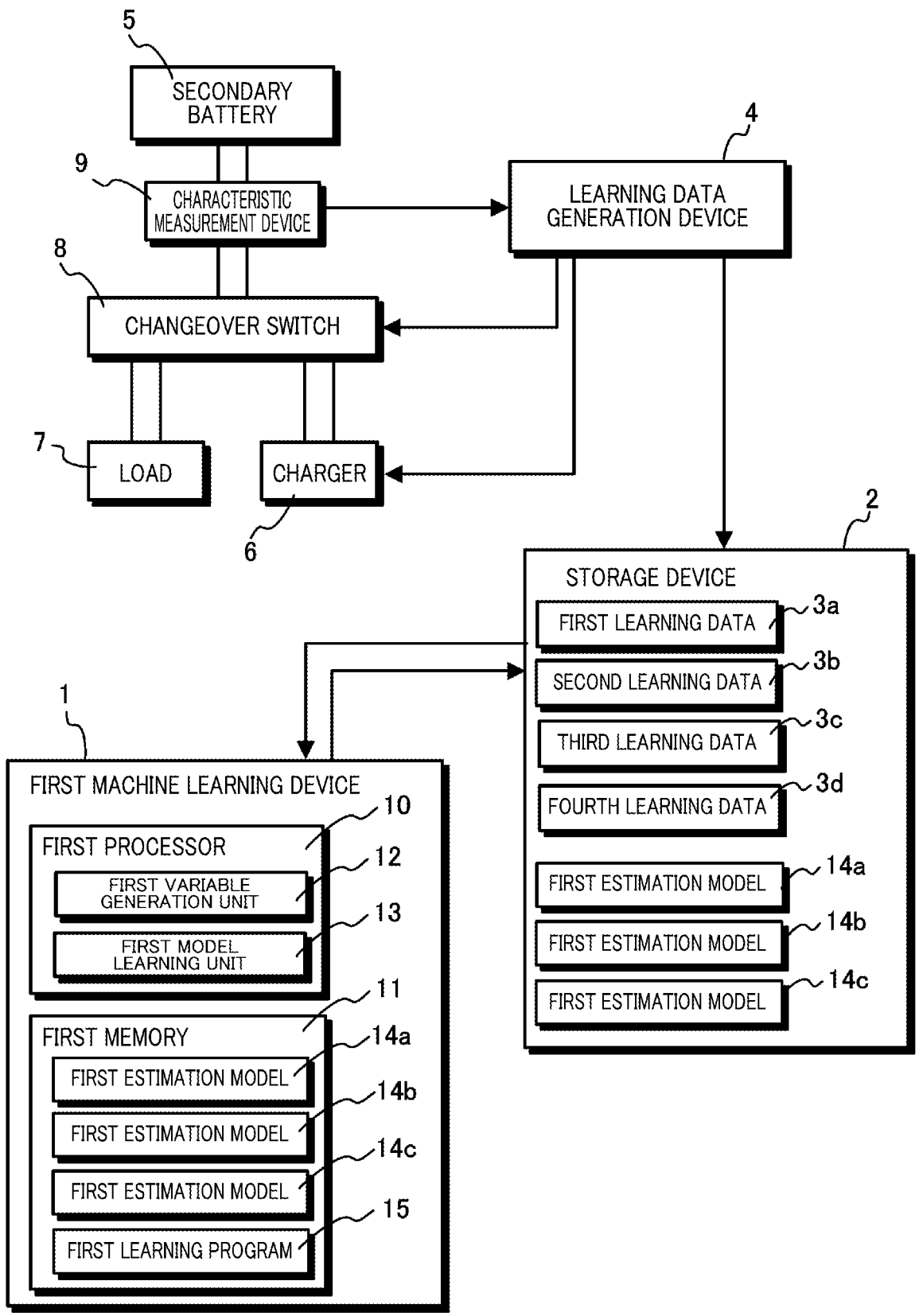
FIG. 2 is a diagram showing an example of a configuration of a first machine learning device that performs machine learning of a first estimation model in a first step of the state estimation method.

FIG. 2 is a diagram that shows an example of a configuration of a first machine learning device 1 for preparing, by machine learning, the plurality of first estimation models in step S100 that is a first step of the state estimation method shown in FIG. 1. The first machine learning device 1 acquires learning data from a storage device 2 (memory) and performs the machine learning of each of the plurality of first estimation models. The storage device 2 stores a first learning data $3a$, a second learning data $3b$, a third learning data $3c$, and a fourth learning data $3d$ that are four pieces of learning data for the machine learning. Hereinafter, the first learning data $3a$, the second learning data $3b$, the third learning data $3c$, and the fourth learning data $3d$ are collectively referred to as learning data 3.

The learning data 3 is stored in the storage device 2 by a learning data generation device 4. The learning data generation device 4 causes a secondary battery 5 to operate and measures a characteristic of the secondary battery 5 in operation so as to generate the learning data 3.

The secondary battery 5 is charged by a charger 6 and discharges electricity by feeding electricity to a load 7. The charger 6 is, for example, a DC power supply, and the load 7 is, for example, a motor. The selection to cause the secondary battery 5 to be charged by the charger 6 or to discharge electricity to the load 7 is made by a changeover switch 8. Between the changeover switch 8 and the secondary battery 5, a characteristic measurement device 9 is inserted.

The characteristic measurement device 9 (sensor) measures current values of the various parameters of the electric input, the electric output, and the electric characteristic of the secondary battery 5. In the present embodiment, the parameters of the electric input and the electric output are a terminal voltage Vte and a terminal current Ite of the secondary battery 5, and the parameters of the electric characteristic are an internal resistance Ri of the secondary battery 5 and a temperature T (° C.) of a housing surface of the secondary battery 5. Here, the internal resistance Ri can be the one that is measured, for example, by inputting an alternating current, which is a measurement signal, to the secondary battery 5 according to the conventional art.

The terminal current Ite of the secondary battery 5 can be the one that has a positive value when the secondary battery 5 discharges electricity and has a negative value when the secondary battery 5 is being charged. The terminal voltage Vte and the terminal current Ite represent the electric output and the electric input of the secondary battery 5, respectively, when they are positive and negative values.

The learning data generation device 4 is, for example, a computer that starts to operate by an instruction from an operator, and provides an operation instruction to the charger 6 and a switching operation instruction to the changeover switch 8.

The learning data generation device 4 acquires the terminal current Ite, the terminal voltage Vte, and the internal resistance Ri at the time of the operation of the secondary battery 5, which includes the charge time and the electricity discharge time, from the characteristic measurement device 9 in a predetermined time interval. The learning data generation device 4 calculates an open voltage Voc of the secondary battery 5 from the acquired terminal current Ite, terminal voltage Vte, and internal resistance Ri. Further, the learning data generation device 4 integrates the electricity discharge amount and the charge amount of the secondary battery 5 from the acquired terminal current Ite and terminal voltage Vte according to the conventional art so as to calculate the SOC and the SOH of the secondary battery 5.

The learning data generation device 4 associates time series data of the acquired and calculated terminal current Ite, terminal voltage Vte, temperature T, internal resistance Ri, and open voltage Voc with the calculated SOC and SOH in each measurement point in time and stores them in the storage device 2 as the learning data 3.

Here, the learning data generation device 4 generates various pieces of learning data 3 by causing the secondary battery 5 to perform charging and discharging operations according to various charging and discharging scenarios. In the present embodiment, for example, the secondary battery 5 is a secondary battery for a vehicle, and the learning data generation device 4 uses three different charging and discharging scenarios that indicate typical charging and discharging operations of the secondary battery in different combinations of driving such as city area driving, high speed driving, and mountain area driving. The learning data generation device 4 causes the secondary battery 5 to perform the charging and discharging operations according to the three charging and discharging scenarios, generates and stores, in the storage device 2, the first learning data 3a, the second learning data 3b, the third learning data 3c, and the fourth learning data 3d, which are four pieces of learning data 3 that are different from each other.

The first machine learning device 1 is provided with a first processor 10 and a first memory 11. The first memory 11 is composed of, for example, volatile and/or nonvolatile semiconductor memories, and/or a hard disk device and the like. The first memory 11 stores first estimation models 14a, 14b and 14c that are three estimation models trained by a first model learning unit 13. Hereinafter, the first estimation models 14a, 14b and 14c are collectively referred to as a first estimation model 14.

In the present embodiment, the first estimation model 14 is composed of the machine learning models having the model structures being different from each other. For example, the first estimation model 14a is composed of the RNN that uses the Gated Recurrent Unit (GRU) as an intermediate layer thereof. Further, the first estimation model 14b is composed of the RNN that uses the Long Short Term Memory (LSTM) as an intermediate layer thereof. Further, the first estimation model 14c is composed of the one-dimensional CNN.

The first processor 10 is, for example, a computer provided with a processor such as a Central Processing Unit (CPU). The first processor 10 may be configured to include a Read Only Memory (ROM) in which a program has been written, a Random Access Memory (RAM) for temporary storage of data, and the like. Then, the first processor 10 is provided with a first variable generation unit 12 and a first model learning unit 13 as functional elements or functional units thereof.

These functional elements provided to the first processor 10 are realized, for example, when the first processor 10 that is a computer executes a first learning program 15 stored in the first memory 11. Note that it is possible to store the first learning program 15 in an arbitrary computer-readable storage medium. In lieu of this, all or a part of the functional elements provided to the first processor 10 can be constructed of hardware including one or more electronic circuit components, respectively.

The first variable generation unit 12 reads the learning data 3 from the storage device 2 and generates a first state variable, a second state variable, and a third state variable that are the state variables to be given to each of the first estimation models 14a, 14b and 14c. The first state variable, the second state variable, and the third state variable include sets, which are different from each other, of the parameters that represent the electric input, the electric output, and/or the electric characteristic, respectively.

Specifically, the first state variable includes a set of the terminal current Ite, the terminal voltage Vte, and the open voltage Voc as the parameters, and the second state variable includes a set of the terminal current Ite, the terminal voltage Vte, a current increment $\Delta$Ite, a voltage increment $\Delta$Vte, and the open voltage Voc as the parameters. Further, the third state variable includes a set of the terminal current Ite, the terminal voltage Vte, an integrated current $\Sigma$Ite, an integrated voltage $\Sigma$Vte, and the internal resistance Ri as the parameters.

Here, the current increment $\Delta$Ite refers to an increment from a value at the last measurement time of the terminal current Ite, and the voltage increment $\Delta$Vte refers to an increment from a value at the last measurement time of the terminal voltage Vte. Further, the integrated current $\Sigma$Ite refers to an integrated value from a past of a predetermined time to the present of the terminal current Ite, and the integrated voltage $\Sigma$Vte refers to an integrated value from a past of a predetermined time to the present of the terminal voltage Vte.

The first variable generation unit 12 generates the first state variable from the first learning data 3a as well as first teacher data that is composed of the SOC and the SOH in each point in time, which are extracted from the first learning data 3a. The first variable generation unit 12 transmits the generated first state variable and first teacher data to the first model learning unit 13. Further, the first variable generation unit 12 generates the second state variable from the second learning data 3b as well as second teacher data that is composed of the SOC and the SOH in each point in time, which are extracted from the second learning data 3b. The first variable generation unit 12 transmits the generated second state variable and second teacher data to the first model learning unit 13.

In the same manner, the first variable generation unit 12 generates the third state variable from the third learning data 3c as well as third teacher data that is composed of the SOC and the SOH in each point in time, which are extracted from the third learning data 3c. The first variable generation unit 12 transmits the generated third state variable and third teacher data to the first model learning unit 13.

The first model learning unit 13 causes the first estimation models 14a, 14b and 14c that are the plurality of estimation models to learn, by machine learning, the relation of the state variables indicating the electric input, the electric output, and/or the electric characteristic of the secondary battery 5 in operation, to the SOC and/or the SOH of the secondary battery 5 in operation.

The first model learning unit 13 causes the first estimation models 14a, 14b and 14c to learn by respectively using the first learning data 3a, the second learning data 3b, and the third learning data 3c that are different from each other. Specifically, the first model learning unit 13 causes the first estimation model 14a to learn by using the first state variable and the first teacher data that the first variable generation unit 12 has generated from the first learning data 3a. Further, the first model learning unit 13 causes the first estimation model 14b to learn by using the second state variable and the second teacher data that the first variable generation unit 12 has generated from the second learning data 3b. In a similar manner, the first model learning unit 13 causes the first estimation model 14c to learn by using the third state variable and the third teacher data that the first variable generation unit 12 has generated from the third learning data 3c.

The first model learning unit 13 stores, in the storage device 2, the first estimation models 14a, 14b and 14c that have completed the learning. Thereby, the preparation of the first estimation models 14 is completed.

[Second Step]

Figure 3:
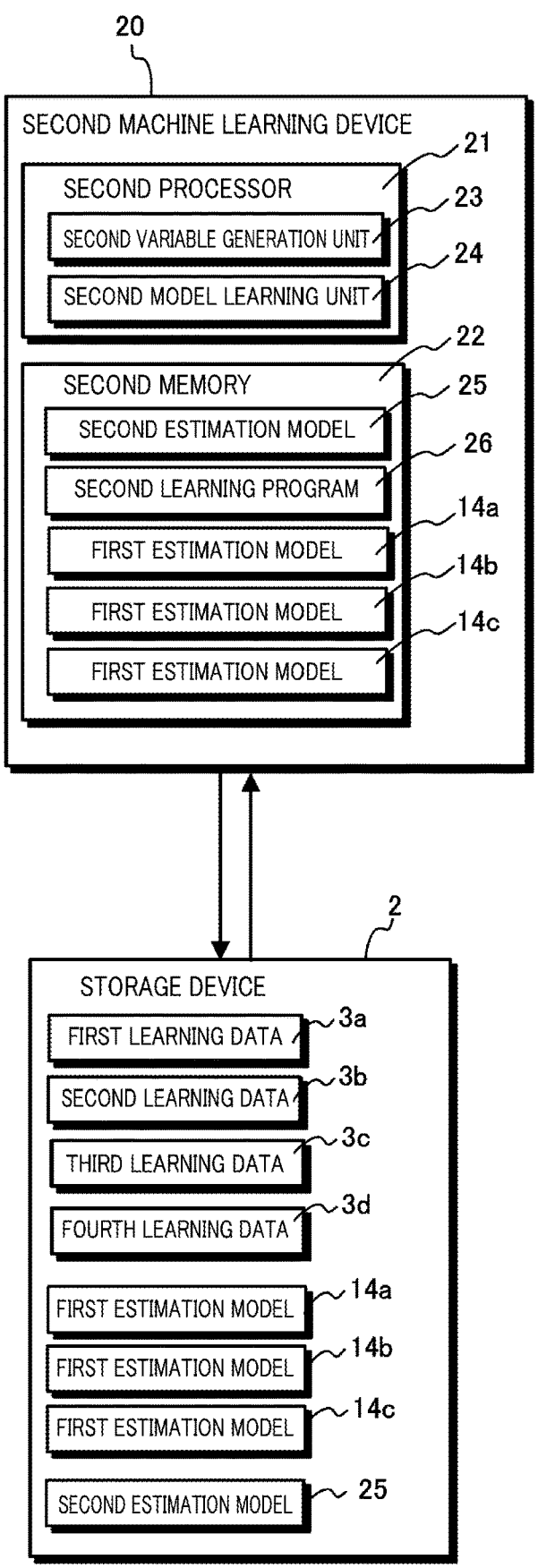
FIG. 3 is a diagram showing an example of a configuration of a second machine learning device that performs machine learning of a second estimation model in a second step of the state estimation method.

FIG. 3 is a diagram that shows an example of a configuration of a second machine learning device 20 for preparing, by machine learning, the second estimation model in step S102 that is a second step of the state estimation method shown in FIG. 1. In FIG. 3, components that are the same as the components shown in FIG. 2 will be indicated by using reference signs that are the same as the reference signs shown in FIG. 2, to which the explanation of FIG. 2 described above will be applied. Note that the second estimation model is a machine learning model in the present embodiment, but the second estimation model may be a model having other model structures such as a rule-based model.

The second machine learning device 20 performs the machine learning of the second estimation model by using the first estimation models 14a, 14b and 14c, which are the three learned estimation models, generated by the first machine learning device 1 in the first step described above, and the fourth learning data 3d generated by the learning data generation device 4.

The second machine learning device 20 is provided with a second processor 21 and a second memory 22. The second memory 22 is composed of, for example, volatile and/or nonvolatile semiconductor memories, and/or a hard disk device and the like. The second memory 22 stores a second estimation model 25 trained by a second model learning unit 24.

The second estimation model 25 learns, by machine learning, the relation of the state variables of the secondary battery in operation to the selection of the one first estimation model 14 for estimating the SOC and the SOH with the highest accuracy. In other words, the second estimation model 25 is a model for estimating, from the inputs of the state variables of the secondary battery in operation, which is the one first estimation model 14 for estimating the SOC and/or the SOH having the highest accuracy in the inputs of the state variables.

Further, the first estimation models 14a, 14b and 14c, which are the three learned estimation models, generated by the first machine learning device 1 in the first step described above, are read from the storage device 2 and stored in the second memory 22.

The second processor 21 is, for example, a computer provided with a processor such as a CPU. The second processor 21 may be configured to include a ROM in which a program has been written, a RAM for temporary storage of data, and the like. Then, the second processor 21 is provided with a second variable generation unit 23 and a second model learning unit 24 as functional elements or functional units thereof.

These functional elements provided to the second processor 21 are realized, for example, when the second processor 21 that is a computer executes a second learning program 26 stored in the second memory 22. Note that it is possible to store the second learning program 26 in an arbitrary computer-readable storage medium. In lieu of this, all or a part of the functional elements provided to the second processor 21 can also be constructed of hardware including one or more electronic circuit components, respectively.

The second variable generation unit 23 reads the learning data 3 from the storage device 2 and generates the state variable to be given to the second estimation model 25. The second variable generation unit 23 reads the fourth learning data 3d from the storage device 2 as the learning data to be used for the machine learning of the second estimation model 25, for example, and generates the fourth state variable to be given to the second estimation model 25. The fourth state variable can include all the parameters or a part of the parameters that indicate the electric input, the electric output, and the electric characteristic of the secondary battery, which are included in the first state variable, the second state variable, and the third state variable used in the learning of the first estimation models 14 described above. In the present embodiment, for example, the fourth state variable includes, as the parameters described above, the terminal current Ite, the terminal voltage Vte, and the open voltage Voc.

The second variable generation unit 23 also generates fourth teacher data that is composed of the SOC and the SOH in each point in time, which are extracted from the fourth learning data 3d. Then, the second variable generation unit 23 transmits the generated fourth state variable and fourth teacher data to the second model learning unit 24.

Further, in the same manner as the first variable generation unit 12 of the first machine learning device 1 described above, the second variable generation unit 23 generates, from the fourth learning data 3d, the first state variable, the second state variable, and the third state variable to be given to the first estimation models 14a, 14b and 14c that have already been trained. The second variable generation unit 23 transmits the generated first state variable, second state variable, and third state variable to the second model learning unit 24.

The second model learning unit 24 performs the learning of the second estimation model 25 by using the fourth state variable and the fourth teacher data generated by the second variable generation unit 23.

Specifically, the second model learning unit 24 first inputs the first state variable, the second state variable, and the third state variable at the same measurement point in time, which are generated by the second variable generation unit 23, to the first estimation models 14a, 14b and 14c, respectively, so as to acquire an estimate value of the SOC from each of these first estimation models 14. Further, the second model learning unit 24 calculates an absolute value of a difference among each of the acquired SOC estimate values and the SOC at the measurement time that is indicated by the fourth teacher data. The second model learning unit 24 identifies the first estimation model 14 that outputs the SOC estimate value having the smallest absolute value of the difference, as the one first estimation model 14 for performing the SOC estimation having the highest accuracy at the measurement time.

Then, the second model learning unit 24 causes the second estimation model 25 to learn the relation of the fourth state variable at the measurement time to the identification result of the first estimation model 14 that performs the SOC estimation having the highest accuracy. The second model learning unit 24 repeats the learning about the second estimation model 25 while changing the measurement time.

The second model learning unit 24 stores, in the storage device 2, the second estimation model 25 that has completed the learning.

[Third Step]

The third step is executed by, for example, a state estimation system. The state estimation system is provided with the plurality of first estimation models for estimating the state of the object to be monitored on the basis of the state variable measured with respect to the object to be monitored. Further, the state estimation system is provided with the second estimation model for estimating which is the one first estimation model for estimating the state of the object to be monitored with the highest accuracy on the basis of the state variable measured with respect to the object to be monitored. Further, the state estimation system is provided with a state estimation unit for estimating the one first estimation model by way of the second estimation model on the basis of a state variable of the object to be monitored that is measured at present, and for estimating and outputting the state of the object to be monitored from a state variable of the object to be monitored that is measured at present by using the estimated one first estimation model.

Figure 4:
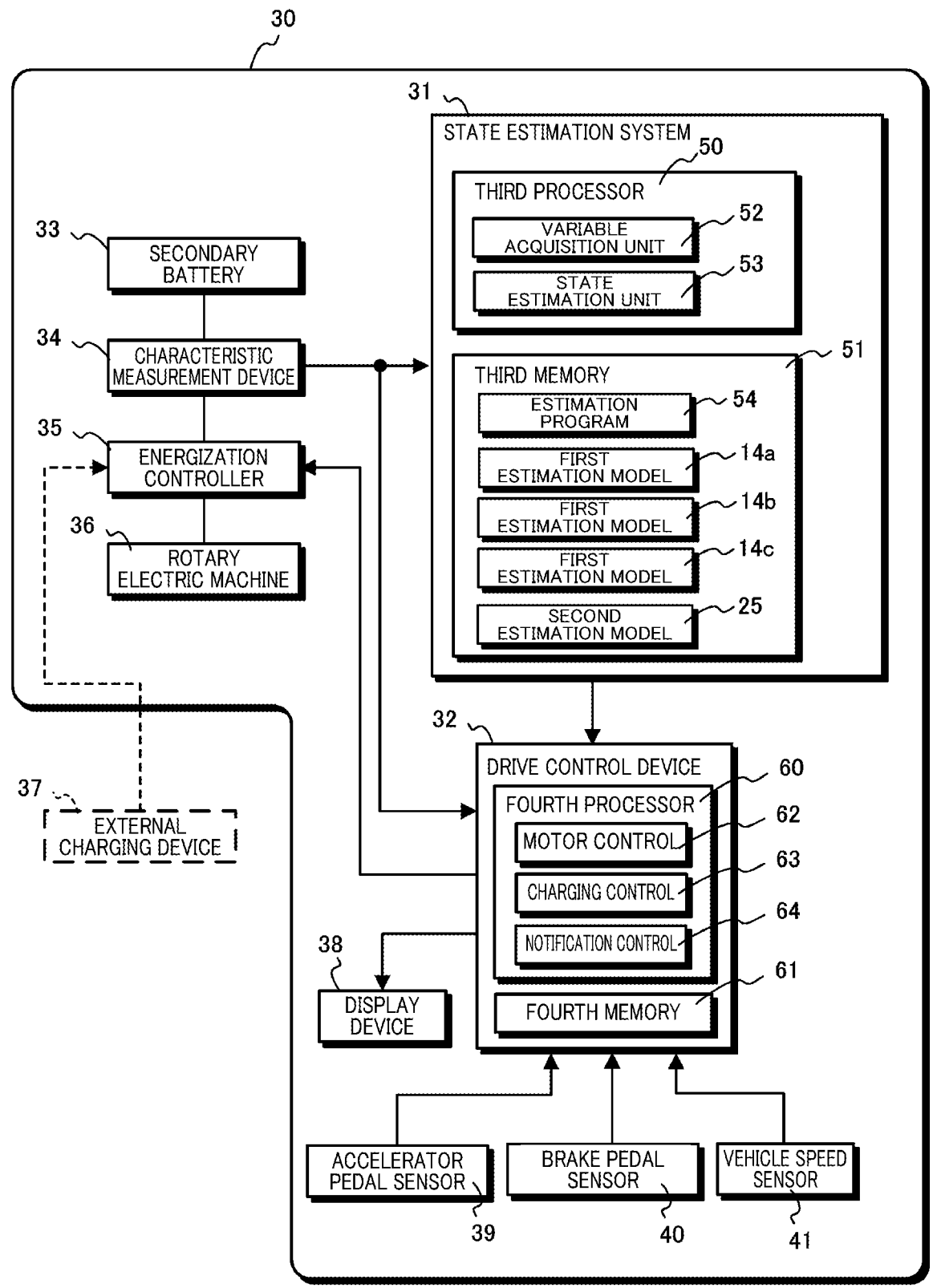
FIG. 4 is a diagram showing an example of a configuration of a state estimation system that performs, as a third step of the state estimation method, a state estimation of a secondary battery in operation that is an object to be monitored.

FIG. 4 is a diagram showing a configuration of a state estimation system 31 that is an example of such a state estimation system. In FIG. 4, components that are the same as the components shown in FIGS. 2 and 3 will be indicated by using reference signs that are the same as the reference signs shown in FIGS. 2 and 3, to which the explanation of FIGS. 2 and 3 described above will be applied.

The state estimation system 31 shown in FIG. 4 is, for example, mounted on a vehicle 30. The state estimation system 31 selects the one first estimation model 14 by way of the second estimation model 25, from among the state variables acquired from a secondary battery 33 in operation that is mounted on the vehicle 30, and outputs the SOC of the secondary battery 33 in operation, which is estimated by the selected first estimation model 14, as an estimate value output to a drive control device 32.

The secondary battery 33 is connected to a rotary electric machine 36 through a characteristic measurement device 34 (sensor) and an energization controller 35 (computer, circuit). The rotary electric machine 36 functions as a motor for driving wheels of the vehicle 30 when power is supplied by the electric discharge from the secondary battery 33, and also functions as a generator for generating electricity by a rotational force transmitted from the wheels so as to charge the secondary battery 33.

The characteristic measurement device 34 outputs, to the state estimation system 31, the measurement values of the parameters indicating the electric input, the electric output, and/or the electric characteristic of the secondary battery 33, which include the terminal current Ite, the terminal voltage Vte, and the internal resistance Ri of the secondary battery 33. The energization controller 35 controls an energization amount from the secondary battery 33 to the rotary electric machine 36 and an energization amount from the rotary electric machine 36 to the secondary battery 33 under the control of the drive control device 32 mounted on the vehicle 30. Further, the energization controller 35 controls an energization amount from an external charging device 37 to the secondary battery 33 under the control of the drive control device 32 when the external charging device 37 existing outside of the vehicle 30 is connected to the vehicle 30. The external charging device 37 is, for example, a charger of a charging stand. Further, when other generators driven by an internal combustion engine are mounted on the vehicle 30, the energization controller 35 can also control an energization amount from the generators to the secondary battery.

The drive control device 32 acquires, from the state estimation system 31, the current estimate value of the SOC that shows the state of the secondary battery 33, controls the operation of the rotary electric machine 36 on the basis of the acquired SOC, and provides notification to a user.

Specifically, the drive control device 32 includes a fourth processor 60 and a fourth memory 61. The fourth memory 61 is, for example, a semiconductor memory to store data necessary for processing in the fourth processor 60.

The fourth processor 60 is, for example, a computer provided with a processor such as a CPU. The fourth processor 60 may be configured to include a ROM in which a program has been written, a RAM for temporary storage of data, and the like. Then, the fourth processor 60 is provided with a motor control unit 62, a charging control unit 63, and a notification control unit 64 as functional elements or functional units thereof.

These functional elements provided to the fourth processor 60 are realized, for example, when the fourth processor 60 that is a computer executes a program. Note that it is possible to store the computer program in an arbitrary computer-readable storage medium. In lieu of this, all or a part of the functional elements provided to the fourth processor 60 can also be constructed of hardware including one or more electronic circuit components, respectively.

The motor control unit 62 detects, from an accelerator pedal sensor 39, a stepping amount of an accelerator pedal (not shown) of the vehicle 30. When the accelerator pedal is stepped on, the drive control device 32 instructs the energization controller 35 to feed electricity from the secondary battery 33 to the rotary electric machine 36, and causes the vehicle 30 to be driven by the rotary electric machine 36 as the motor so that the vehicle 30 travels. Further, the drive control device 32 controls a rotational frequency of the rotary electric machine 36 through the energization controller 35 so that the speed of the vehicle 30 acquired from a vehicle speed sensor 41 is a speed corresponding to the stepping amount of the accelerator pedal.

At this time, the motor control unit 62 limits an upper limit value of an electric current (a maximum energization current) fed from the secondary battery 33 to the rotary electric machine 36 when the vehicle 30 is accelerating or driving at a constant speed, for example, on the basis of the current SOC estimate value acquired from the state estimation system 31. In other words, in order to limit the electric discharge of the secondary battery 33, for example, by limiting a torque to be generated by the rotary electric machine 36, the motor control unit determines the maximum energization current so that a fuel consumption (for example, a mileage per 1 kWh), which is determined from the characteristics of the secondary battery 33 and the rotary electric machine 36, is not below a predetermined value.

The charging control unit 63 determines whether or not a brake pedal (not shown) of the vehicle 30 is stepped on by way of a brake pedal sensor 40. Then, when the brake pedal is stepped on, the charging control unit 63 instructs the motor control unit 62 to stop feeding electricity from the secondary battery 33 to the rotary electric machine 36. Then, the charging control unit 63 instructs the energization controller 35 to feed electricity from the rotary electric machine 36 to the secondary battery 33 so as to operate the rotary electric machine 36 as the generator, and performs charging (so-called regenerative braking) from the rotary electric machine 36 to the secondary battery 33.

Further, when the external charging device 37 is connected to the vehicle 30, the charging control unit 63 controls a power supply amount from the external charging device 37 to the secondary battery 33 through the energization controller 35.

The notification control unit 64 performs a predetermined display on a display device 38 (display) on the basis of the current SOC estimate value that is acquired from the state estimation system 31. For example, the notification control unit 64 simply displays the acquired current SOC estimate value on the display device 38. Further, when the SOC estimate value drops below a predetermined value, for example, the notification control unit 64 displays, on the display device 38, a message that suggests, to a driver of the vehicle 30, charging at the charging stand.

The state estimation system 31 executes step S104 of the characteristic estimation method shown in FIG. 1, and estimates the current SOC of the secondary battery 33 in operation. Then, the state estimation system 31 outputs the estimate value of the SOC that has been estimated to the drive control device 32.

Specifically, the state estimation system 31 includes a third processor 50 and a third memory 51. The third memory 51 is composed of non-volatile and volatile semiconductor memories. The first estimation models 14a, 14b and 14c and the second estimation model 25 prepared in steps S100 and S102 described above are read from the storage device 2 and stored in the third memory 51 in advance.

The third processor 50 is, for example, a computer provided with a processor such as a CPU. The third processor 50 may be configured to include a ROM in which a program has been written, a RAM for temporary storage of data, and the like. Then, the third processor 50 is provided with a variable acquisition unit 52 and a state estimation unit 53 as functional elements or functional units thereof.

These functional elements provided to the third processor 50 are realized, for example, when the third processor 50 that is a computer executes an estimation program 54 stored in the third memory 51. Note that it is possible to store the estimation program 54 in an arbitrary computer-readable storage medium. In lieu of this, all or a part of the functional elements provided to the third processor 50 can also be constructed of hardware including one or more electronic circuit components, respectively.

A functional block diagram of the third processor 50 including the variable acquisition unit 52 and the state estimation unit 53 is shown in FIG. 5. In FIG. 5, rectangles shown by the dotted lines show processing in the variable acquisition unit 52 and the state estimation unit 53, respectively.

The variable acquisition unit 52 and the state estimation unit 53 execute step S104 of the characteristic estimation method shown in FIG. 1.

First, the variable acquisition unit 52 acquires, in a predetermined time interval, the terminal current Ite, the terminal voltage Vte, and the internal resistance Ri of the secondary battery 33 in operation as a terminal current Ite(t), a terminal voltage Vte(t), and an internal resistance R(t) (a process 200 shown in FIG. 5). Further, the variable acquisition unit 52 calculates a current increment ΔIte(t) and an integrated current ΣIte(t), and a voltage increment ΔVte(t) and an integrated voltage ΣVte(t) from the acquired terminal current Ite(t) and terminal voltage Vte(t), respectively (a process 202 shown in FIG. 5). Further, the variable acquisition unit 52 calculates an open voltage Voc(t) from the terminal current Ite(t), the terminal voltage Vte(t), and the internal resistance Ri(t) (a process 204 shown in FIG. 5). Hereinafter, the terminal current Ite(t), the terminal voltage Vte(t), the internal resistance Ri(t), the current increment ΔIte(t), the integrated current ΣIte (t), the voltage increment ΔVte(t), the integrated voltage ΣVte(t), and the open voltage Voc(t) that the variable acquisition unit 52 has acquired or calculated are collectively referred to as state data.

Next, from the state data acquired or calculated by the variable acquisition unit 52, the state estimation unit 53 generates fourth state variables including the terminal current Ite(t), the terminal voltage Vte(t), and the open voltage Voc(t), and inputs them to the second estimation model 25. Then, by way of the second estimation model 25, the state estimation unit 53 acquires the selection (or the estimation) as to which is the one first estimation model 14 having the highest accuracy in the current value of the fourth state variable, and generates only the state variable to be input to the one first estimation model 14 having the highest accuracy in accordance with the acquired selection (a process 206 shown in FIG. 5).

For example, the state estimation unit 53 generates only the first state variable to be input to the first estimation model 14a from the state data acquired or calculated by the variable acquisition unit 52, when the one first estimation model 14 having the highest accuracy in the current value of the fourth state variable, which is selected or estimated by the second estimation model 25, is the first estimation model 14a. As described above, the first state variables include the terminal current Ite(t), the terminal voltage Vte(t), and the open voltage Voc(t).

Then, the state estimation unit 53 inputs the generated state variable to the corresponding first estimation model 14 so as to acquire the estimate value of the SOC. The state estimation unit 53 outputs, to the drive control device 32, the acquired estimate value of the SOC as the SOC estimate value output (a process 208 shown in FIG. 5). Thereby, the state estimation unit 53 outputs, to the drive control device 32, the estimate value of the SOC that is estimated by the one first estimation model 14 having the highest accuracy in the current value of the fourth state variable, which is estimated by the second estimation model 25, as the SOC estimate value output.

[Modification]

In the embodiment described above, as shown in FIG. 5, the state estimation unit 53 of the state estimation system 31 generates only the state variable to be input to the one first estimation model 14 having the highest accuracy in the current value of the fourth state variable that is estimated or selected by the second estimation model 25. As a result, the SOC is estimated by the estimated first estimation model 14 having the highest accuracy. In other words, in the third step of the embodiment described above, the state of the secondary battery in operation, which is the object to be monitored, is estimated by using only the one first estimation model estimated by the second estimation model, and the result of the estimation is output.

However, the processing in the third step is not limited to the above. For example, in the third step, an estimation result on the state of the object to be monitored in each of the plurality of first estimation models may be acquired so as to output the estimation result of the one first estimation model estimated by the second estimation model 25 from among the acquired estimation results. In other words, as a modification, the state estimation unit 53 may acquire the SOC estimate values from all the first estimation models 14 and select one of these SOC estimate values on the basis of the estimation results of the second estimation model 25, so as to use it as the SOC estimate value output.

FIG. 6 is a functional block diagram of the third processor 50 that uses a state estimation unit 53-1 according to such a modification. In FIG. 6, reference signs that are the same as the reference signs in FIG. 5 will be used for components that are the same as the components shown in FIG. 5, to which the explanation of FIG. 5 described above will be applied.

In FIG. 6, the state estimation unit 53-1 generates, from the state data acquired or calculated by the variable acquisition unit 52, the first state variable, the second state variable, and the third state variable, and inputs them to the first estimation models 14a, 14b and 14c, respectively. Thereby, the state estimation unit 53-1 obtains the SOC estimate values from all the first estimation models 14 (a process 306 shown in FIG. 6).

Further, the state estimation unit 53-1 generates the fourth state variable from the state data acquired or calculated by the variable acquisition unit 52, and inputs it to the second estimation model 25. Thereby, the state estimation unit 53-1 obtains, from the second estimation model 25, the selection result (or the estimation result) as to which is the first estimation model 14 estimated to have the highest accuracy also in the current value of the fourth state variable. Then, the state estimation unit 53-1 selects, on the basis of the selection result, the SOC estimate value of the first estimation model 14 estimated to have the highest accuracy from among the SOC estimate values obtained from all the first estimation models 14, and uses the SOC estimate value as the SOC estimate value output (a process 308 of FIG. 6).

Other Embodiments

In the embodiment described above, the state estimation system 31 is a single device, but the state estimation system 31 may be constructed of a server device and a client device connected communicably with each other. For example, the state estimation system 31 can be the one in which the variable acquisition unit 52 is provided to the client device, and the state estimation unit 53, the first estimation models 14, and the second estimation model 25 are provided to the server device.

Alternatively, all of the first estimation models 14 may be stored in the server device. The client device can be provided with the second estimation model 25, and use the first estimation model 14 having the highest estimation accuracy, which is estimated by the second estimation model 25, after downloading it from the server device to the client device.

In the embodiment described above, the second estimation model estimates which is the one first estimation model for estimating the state of the object to be monitored with the highest accuracy on the basis of the state variable measured with respect to the object to be monitored, but the second estimation model is not limited to this. The second estimation model may estimate which is the one first estimation model for estimating the state of the object to be monitored with the highest accuracy on the basis of the state variable measured with respect to the utilization device that runs by using the object to be monitored.

For example, when the object to be monitored is the secondary battery in operation that is mounted on the vehicle, the second estimation model can estimate which is the one first estimation model for estimating the state of the secondary battery with the highest accuracy on the basis of state variables including a vehicle speed, an acceleration, a gradient of a path on which the vehicle is currently travelling, a load situation of the vehicle, and the like that are measured with respect to the vehicle as the utilization device that runs by using the secondary battery.

In the embodiment described above, as an example, the state estimation method uses the secondary battery in operation as the object to be monitored and estimates the SOC and/or the SOH of the secondary battery as the state of the object to be monitored, but the state estimation method is not limited to this. In the state estimation method according to the present invention, it is possible to estimate an arbitrary state of an arbitrary object to be monitored. For example, in the state estimation method according to the present invention, it is possible to use a vehicle as the object to be monitored, use an elapsed time from the delivery of the vehicle and a mileage as the state variables, and estimate the life of a part mounted on the vehicle as the state of the vehicle. Further, in the state estimation method, a driving pattern and a state such as sleepiness of a driver may be estimated with the driver of the vehicle being used as the object to be monitored and a driving time and/or a heart rate per minute of the driver being used as the state variables. Alternatively, in the state estimation method, positions of the vehicle and a walker existing in the periphery of the vehicle when the vehicle is in an automatic driving mode may be estimated as the state, with a LiDAR device mounted on the vehicle being used as the object to be monitored and a weather, a temperature, and a humidity of the environment in which the vehicle exists and/or an arrival time of a reflected signal of the LiDAR device being used as the state variables.

In the embodiment described above, the learning data 3 is generated when the learning data generation device 4 causes the secondary battery 5 to operate so as to measure the characteristic of the secondary battery 5 in operation, but the learning data 3 is not limited to this. The learning data to be used for the learning of the first estimation model and/or the second estimation model can be calculated by simulations in accordance with various modes of use that are assumed for the object to be monitored. The first estimation model and/or the second estimation model can be trained by using various time series data of the state variables calculated with respect to the object to be monitored as described above.

In the embodiment described above, the plurality of first estimation models 14 are composed of the machine learning models that are different from each other, and trained by the learning data 3 that are different from each other, but the plurality of first estimation models 14 are not limited to this.

As long as, among the respective first estimation models 14, the combinations of the machine learning models of which the first estimation models 14 are composed and the learning data used for the learning are different from each other, the first estimation models 14 can be composed of arbitrary machine learning models and trained by arbitrary learning data.

For example, the plurality of first estimation models 14 may all be composed of the same machine learning model and each of the plurality of first estimation models 14 may be trained by the learning data 3 that is different from each other. Further, for example, the plurality of first estimation models 14 may each be composed of a machine learning model that is different from the others, and all of the plurality of first estimation models 14 may be trained by the same learning data 3.

Further, the combinations of the parameters of the electric input, the electric output, and/or the electric characteristic of the secondary battery in operation included in the state variables to be input to the respective first estimation models 14 are not limited to the above-described examples of the first state variable, the second state variable, and the third state variable, and can be arbitrarily determined. Such a combination of the parameters can include a parameter other than the terminal current $Ite(t)$, the terminal voltage $Vte(t)$, the internal resistance $Ri(t)$, the current increment $\Delta Ite(t)$, the integrated current $\Sigma Ite(t)$, the voltage increment $\Delta Vte(t)$, the integrated voltage $\Sigma Vte(t)$, and the open voltage $Voc(t)$ that are exemplified in the embodiment described above. In the same manner, the state variables to be used for the learning of the second estimation model 25 are not limited to the above-described example of the fourth state variable, and can be an arbitrary combination of arbitrary parameters.

Further, the number of the first estimation models 14 to be used for the state estimation system 31 is three in the embodiment described above, but an arbitrary number that is 2 or larger can be used.

Further, in the embodiment described above, the second estimation model 25 is the one that has been trained to select the first estimation model 14 for estimating the SOC having the highest accuracy, but the second estimation model 25 may be one that has been trained to select the first estimation model 14 for estimating the SOH having the highest accuracy. In this case, the state estimation system 31 can be configured to estimate the SOH of the secondary battery 33 in operation and output the estimate to the drive control device 32.

Alternatively, the second estimation model 25 may be one that has been trained to select the first estimation model 14 for estimating the SOC having the highest accuracy and the first estimation model 14 for estimating the SOH having the highest accuracy. This makes it possible for the state estimation system 31 to determine the SOC estimate value output and the SOH estimate value output by using the first estimation model 14 for estimating the SOC having the highest accuracy and the first estimation model 14 for estimating the SOH having the highest accuracy, respectively.

Note that the present invention is not limited to the configuration of the embodiments described above, and can be implemented in various aspects in the scope that does not deviate from the subject matter thereof.

[Configurations Supported by the Embodiments and the Modification]

The embodiments and the modification described above support the following configurations.

(Configuration 1) A state estimation method for estimating a state of an object to be monitored, the state estimation method including a first step of preparing a plurality of first estimation models for estimating the state of the object to be monitored on the basis of a state variable measured with respect to the object to be monitored, a second step of preparing a second estimation model for estimating, from among the plurality of first estimation models, which one of the first estimation models estimates the state of the object to be monitored with the highest accuracy, on the basis of the state variable measured with respect to the object to be monitored or a state variable measured with respect to a utilization device that runs by using the object to be monitored, and a third step of outputting a result of estimation of the state of the object to be monitored of the one first estimation model estimated by the second estimation model.

According to the state estimation method of the configuration 1, the state estimation of the object to be monitored is performed by using the one first estimation model estimated, by the second estimation model, to be the one that estimates the state of the object to be monitored with the highest accuracy in accordance with temporal behavior and the like of the state variable at each time of measurement of the object to be monitored. Therefore, it is possible to estimate the state of the object to be monitored in a more stable and accurate manner.

(Configuration 2) The state estimation method according to the configuration 1, in which in the third step, the state of the object to be monitored is estimated by using only the one first estimation model estimated by the second estimation model, and the result of the estimation is output.

According to the state estimation method of the configuration 2, the state of the object to be monitored is estimated by using only the one first estimation model estimated to have the highest estimation accuracy by the second estimation model. Therefore, it is possible to reduce a processing amount.

(Configuration 3) The state estimation method according to the configuration 1, in which in the third step, an estimation result of the state of the object to be monitored in each of the plurality of first estimation models is acquired, and the estimation result of the one first estimation model estimated by the second estimation model from among the acquired estimation results, is output.

According to the state estimation method of the configuration 3, the estimation of the one first estimation model having the highest estimation accuracy by way of the second estimation model and the state estimation of the object to be monitored by using the plurality of first estimation models can be processed in parallel. Therefore, it is possible to improve responsiveness from the acquisition (or the generation) of the state variable of the object to be monitored to the output of the state estimation result.

(Configuration 4) The state estimation method according to any one of the configurations 1 to 3, in which in at least some of the plurality of first estimation models, model structures are different from each other.

According to the state estimation method of the configuration 4, the state can be estimated by using the plurality of first estimation models that have various characteristics. Therefore, it is possible to obtain one estimate value output having a higher accuracy.

(Configuration 5) The state estimation method according to any one of the configurations 1 to 4, in which the plurality of first estimation models include a machine learning model.

According to the state estimation method of the configuration 5, it is possible to use the first estimation model capable of performing a state estimation having a higher accuracy by way of machine learning.

(Configuration 6) The state estimation method according to any one of the configurations 1 to 5, in which at least some of the plurality of first estimation models are machine learning models trained by using learning data that are different from each other.

According to the state estimation method of the configuration 6, the first estimation models having various characteristics trained by different learning data are used. Therefore, it is possible to obtain an estimate value output having a higher accuracy.

(Configuration 7) The state estimation model according to any one of the configurations 1 to 6, in which the first estimation model includes a rule-based model.

According to the state estimation method of the configuration 7, it is possible to use the first estimation model capable of performing a state estimation having a high accuracy that utilizes the characteristic of the rule-based model.

(Configuration 8) The state estimation method according to the configurations 1 to 7, in which in at least some of the plurality of first estimation models, combinations of parameters included in the state variables to be input are different from each other.

According to the state estimation method of the configuration 8, some of the first estimation models perform learning by using the state variables including sets of the parameters that are different from each other. Therefore, it is possible to realize the first estimation models having different characteristics and obtain the estimate value output having a higher accuracy.

(Configuration 9) The state estimation method according to any one of the configurations 1 to 8, in which the object to be monitored is a secondary battery in operation, and the first estimation model estimates a charging rate and/or a degree of deterioration of the secondary battery in operation as the state of the object to be monitored.

According to the state estimation method of the configuration 9, the estimation of the charging rate and/or the degree of deterioration is performed by using the one first estimation model selected, by the second estimation model, as the one for estimating the charging rate and/or the degree of deterioration with the highest accuracy in accordance with temporal behavior and the like at each time of the state variable of the secondary battery in operation. Therefore, it is possible to estimate the charging rate and/or the degree of deterioration of the secondary battery in operation in a more stable and accurate manner.

(Configuration 10) A state estimation system for estimating a state of an object to be monitored, the state estimation system including a plurality of first estimation models for estimating the state of the object to be monitored on the basis of a state variable measured with respect to the object to be monitored, a second estimation model for estimating, from among the plurality of first estimation models, which one of the first estimation models estimates the state of the object to be monitored with the highest accuracy on the basis of the state variable measured with respect to the object to be monitored or a state variable measured with respect to a utilization device that runs by using the object to be monitored, and a state estimation unit for estimating the one first estimation model by way of the second estimation model on the basis of a state variable of the object to be monitored or a state variable of the utilization device that are measured at present so as to estimate and output the state of the object to be monitored from the state variable of the object to be monitored that is measured at present by using the estimated one first estimation model.

According to the state estimation system of the configuration 10, the state estimation of the object to be monitored is performed by using the one first estimation model estimated by the second estimation model to be the one for estimating the state of the object to be monitored with the highest accuracy in accordance with, for example, the temporal behavior and the like of the state variables at each time of measurement of the object to be monitored. Therefore, it is possible to estimate the state of the object to be monitored in a more stable and accurate manner.

REFERENCE SIGNS LIST

1 First machine learning device
2 Storage device
3 Learning data
3a First learning data
3b Second learning data
3c Third learning data
3d Fourth learning data
4 Learning data generation device
5, 33 Secondary battery
6 Charger
7 Load
8 Changeover switch
9, 34 Characteristic measurement device
10 First processor
11 First memory
12 First variable generation unit
13 First model learning unit
14, 14a, 14b and 14c First estimation model
15 First learning program
20 Second machine learning device
21 Second processor
22 Second memory
23 Second variable generation unit
24 Second model learning unit
25 Second estimation model
26 Second learning program
30 Vehicle
31 State estimation system
32 Drive control device
35 Energization controller
36 Rotary electric machine
37 External charging device
38 Display device
39 Accelerator pedal sensor
40 Brake pedal sensor
41 Vehicle speed sensor
50 Third processor
51 Third memory
52 Variable acquisition unit
53, 53-1 State estimation unit
54 Estimation program
60 Fourth processor
61 Fourth memory
62 Motor control unit
63 Charging control unit
64 Notification control unit

What is claimed is:
1. A state estimation method for estimating a state of a secondary battery for a vehicle, the state estimation method comprising:

a first step of generating a first learning data, a secondary learning data, a third learning data, and a fourth learning data, which are four pieces of learning data that are different from each other based on a state variable measured by charging and discharging the secondary battery according to a plurality of different charging and discharging scenarios that indicate charging and discharging operations in different combinations of driving, and preparing a first estimation model, a second estimation model, and a third estimation model for estimating the state of the secondary battery, the first estimation model, the second estimation model, and the third estimation model being estimation models that are learned using each of the first learning data, the second learning data, and the third learning data, respectively;

a second step of preparing a fourth estimation model for estimating which one of the first estimation model, the second estimation model, and the third estimation model is an estimation model that estimates the state of the secondary battery with a highest accuracy, on the basis of the state variable measured with respect to the secondary battery in operation of the vehicle or a state variable measured with respect to the vehicle that runs by using the secondary battery;

a third step of outputting a result of estimation of the state of the secondary battery by one of the first estimation model, the second estimation model, and the third estimation model which is estimated by the fourth estimation model to estimate the state of the secondary battery with the highest accuracy; and a fourth step of controlling an operation of a motor for driving wheels of the vehicle based on the result of estimation of the state of the secondary battery that is output in the third step.

2. The state estimation method according to claim 1, wherein in the third step, the state of the secondary battery is estimated by using only one of the first estimation model, the second estimation model, and the third estimation model which is estimated by the fourth estimation model, and the result of the estimation is output.

3. The state estimation method according to claim 1, wherein in the third step, an estimation result of the state of the secondary battery in each of the plurality of first estimation model, the second estimation model, and the third estimation model is acquired, and among the estimation results, the estimation result of one of the first estimation model, the second estimation model, and the third estimation model which is estimated by the fourth estimation model to estimate the state of the secondary battery with the highest accuracy is output.

4. The state estimation method according to claim 1, wherein the first estimation model, the second estimation model, and the third estimation model estimate a charging rate and/or a degree of deterioration of the secondary battery in operation as the state of the secondary battery.

5. A state estimation system for estimating a state of a secondary battery for a vehicle, the state estimation system comprising a processor, wherein the processor:

using a first estimation model, a second estimation model, and a third estimation model for estimating the state of the secondary battery, the first estimation model, the second estimation model, and the third estimation model being estimation models that are learned using each of a first learning data, a second learning data, and a third learning data, respectively, the first learning data, the second learning data, the third learning data, and a fourth learning data are four pieces of learning data that are different from each other and being generated based on a state variable measured by charging and discharging the secondary battery according to a plurality of different charging and discharging scenarios that indicate charging and discharging operations in different combinations of driving, and a fourth estimation model for estimating which one of the first estimation model, the second estimation model, and the third estimation model is an estimation model that estimates the state of the secondary battery with a highest accuracy on the basis of the state variable measured with respect to the secondary battery or a state variable measured with respect to the vehicle that runs by using the secondary battery, estimates the one of the first estimation model, the second estimation model, and the third estimation model that estimates the state of the secondary battery with the highest accuracy by way of the fourth estimation model on the basis of the state variable of the secondary battery or the state variable of the vehicle that are measured at present so as to estimate and output the state of the secondary battery from the state variable of the secondary battery that is measured at present by using the one of the first estimation model, the second estimation model, and the third estimation model which is estimated by the fourth estimation model to estimate the state of the secondary battery with the highest accuracy; and controls an operation of a motor driving wheels of the vehicle based on the result of the estimation of the state of the secondary battery that is output.

* * * * *